(12) United States Patent
Issa et al.

(10) Patent No.: US 6,653,876 B2
(45) Date of Patent: Nov. 25, 2003

(54) METHOD AND APPARATUS FOR SYNTHESIZING A CLOCK SIGNAL USING A COMPACT AND LOW POWER DELAY LOCKED LOOP (DLL)

(75) Inventors: Sami Issa, Phoenix, AZ (US); Morteza (Cyrus) Afghahi, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/128,325

(22) Filed: Apr. 23, 2002

(65) Prior Publication Data

US 2003/0197536 A1 Oct. 23, 2003

(51) Int. Cl.$^7$ .................................................. H03L 7/00
(52) U.S. Cl. ....................................... 327/158; 327/153
(58) Field of Search ................................. 327/150, 149, 327/153, 158, 159, 161, 269, 270; 331/25; 375/373, 374, 375, 376

(56) References Cited

U.S. PATENT DOCUMENTS

| | | | | |
|---|---|---|---|---|
| 5,514,990 A | * | 5/1996 | Mukaine et al. ............ 327/116 |
| 5,537,068 A | * | 7/1996 | Konno ........................ 327/115 |
| 5,548,235 A | * | 8/1996 | Marbot ....................... 327/158 |
| 6,005,420 A | * | 12/1999 | Yoshizawa et al. ......... 327/116 |
| 6,275,079 B1 | * | 8/2001 | Park ........................... 327/143 |
| 6,295,328 B1 | * | 9/2001 | Kim et al. .................. 375/376 |
| 6,441,659 B1 | * | 8/2002 | Demone .................... 327/156 |

* cited by examiner

Primary Examiner—Timothy P. Callahan
Assistant Examiner—Linh Nguyen
(74) Attorney, Agent, or Firm—McAndrews, Held & Malloy, Ltd.

(57) ABSTRACT

A method and apparatus are disclosed for efficiently doubling a first frequency of a first clock signal. A second clock signal at a second frequency is generated by dividing the first frequency of the first clock signal by two, such that the second frequency is half of the first frequency and a duty cycle of the second clock signal is 50%. Also, a set of phase-delayed clock signals is generated in response to the second clock signal such that the set of phase-delayed clock signals are delayed in phase with respect to the second clock signal. Further, the set of phase-delayed clock signals is combined to generate a third clock signal at a third frequency, such that the third frequency is twice that of the first frequency and a duty cycle of the third clock signal is 50%.

46 Claims, 5 Drawing Sheets

METHOD AND APPARATUS FOR SYNTHESIZING A CLOCK SIGNAL USING A COMPACT AND LOW POWER DELAY LOCKED LOOP (DLL)

BACKGROUND OF THE INVENTION

Certain embodiments of the present invention relate to the synthesis of a clock signal. More specifically, certain embodiments relate to a method and apparatus for efficiently synthesizing a clock signal on a chip such that the synthesized clock signal has a 50% duty cycle. The synthesized clock signal is derived from a system clock signal that is at half the frequency of the synthesized clock signal and whose duty cycle is not required to be 50%.

Highly integrated System-on-Chip (SOC) implementations require clock synthesis and generation to be available on-chip. High speed and high-density memory designs require precise clocking elements to meet timing requirements. For example, one application is to double clock an embedded memory to make the embedded memory appear as a dual port. Double clocking may be accomplished, in part, by doubling the frequency of an existing system clock signal.

Many embedded on-chip clock synthesis implementations consume significant amounts of power and chip area and also are dependent on the duty cycle of a system clock signal from which the synthesized clock signal is being derived. It is often desirable for a synthesized clock signal to have a 50% duty cycle, being independent of the clock signal from which the synthesized clock signal is derived. It is also desirable to synthesize a clock signal in an efficient manner to minimize power consumed and chip area consumed by the clock synthesizing circuitry.

Further limitations and disadvantages of conventional and traditional approaches will become apparent to one of skill in the art, through comparison of such systems with embodiments of the present invention as set forth in the remainder of the present application with reference to the drawings.

BRIEF SUMMARY OF THE INVENTION

An embodiment of the present invention provides an efficient approach to synthesize a new clock signal from a current clock signal such that the new clock signal is at twice the frequency of the current clock signal. The new clock signal has a duty cycle of 50% that is not dependent on the duty cycle of the current clock signal.

An efficient method is provided for doubling a first frequency of a first clock signal. The method includes generating a second clock signal at a second frequency by dividing the first frequency of the first clock signal by two, such that the second frequency is half of the first frequency and a duty cycle of the second clock signal is 50%. The method also includes generating a set of phase-delayed clock signals in response to the second clock signal such that the set of phase-delayed clock signals are delayed in phase with respect to the second clock signal. The method further includes combining the set of phase-delayed clock signals to generate a third clock signal at a third frequency, such that the third frequency is twice that of the first frequency and a duty cycle of the third clock signal is 50%.

Apparatus is provided for doubling a first frequency of a first clock signal. The apparatus includes a divide-by-two circuit that generates a second clock signal at a second frequency that is half of the first frequency, such that a duty cycle of the second clock signal is 50%. The apparatus also includes a delay locked loop (DLL) circuit responsive to the second clock signal to generate a set of phase-delayed clock signals that are delayed in phase with respect to the second clock signal. Further, the apparatus includes a phase combiner circuit responsive to the set of phase-delayed clock signals to generate a third clock signal at a third frequency, such that the third frequency is twice that of the first frequency and a duty cycle of said third clock signal is 50%.

Certain embodiments of the present invention afford an efficient approach for synthesizing a new clock signal from a current clock signal by doubling the frequency of the current clock signal and establishing a 50% duty cycle for the new clock signal that is not dependent on the duty cycle of the current clock signal.

DETAILED DESCRIPTION OF THE INVENTION

Figure 1:
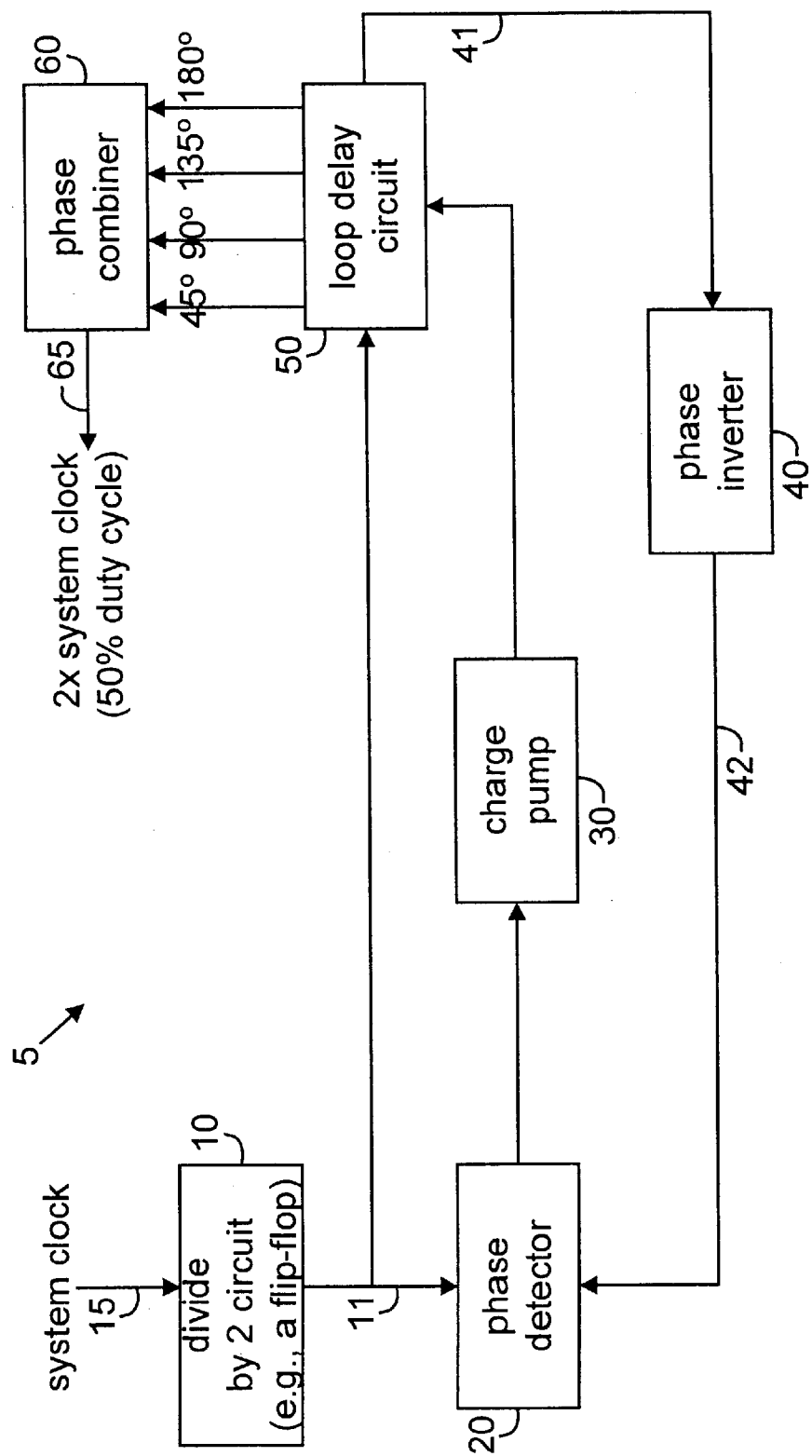
FIG. 1 is a schematic block diagram of an apparatus to synthesize a clock signal in accordance with an embodiment of the present invention.

FIG. 1 is a schematic block diagram of a clock synthesizer 5 that synthesizes a clock signal 65 in accordance with an embodiment of the present invention. The clock synthesizer 5 includes a divide-by-two circuit 10, a phase detector 20, a charge pump 30, a phase inverter 40, a loop delay circuit 50, and a phase combiner 60. The phase detector 20, charge pump 30, phase inverter 40, and loop delay circuit 50 constitute a delay locked loop (DLL).

Referring to FIG. 1, in an embodiment of the present invention, a system clock signal 15 is input to divide-by-two circuit 10. An output of divide-by-two circuit 10 is connected to a first input of phase detector 20 and to a first input of loop delay circuit 50. The output of phase detector 20 is connected to the input of charge pump 30. The output of charge pump 30 is connected to a second input of loop delay circuit 50. The outputs of loop delay circuit 50 are connected to inputs of phase combiner 60. An output of loop delay circuit 50 is connected to the input of phase inverter 40. The output of phase inverter 40 is connected to a second input of phase detector 20. The output of phase combiner 60 is a synthesized clock signal 65 at twice the frequency of system clock 15 and having a 50% duty cycle.

Figure 5:
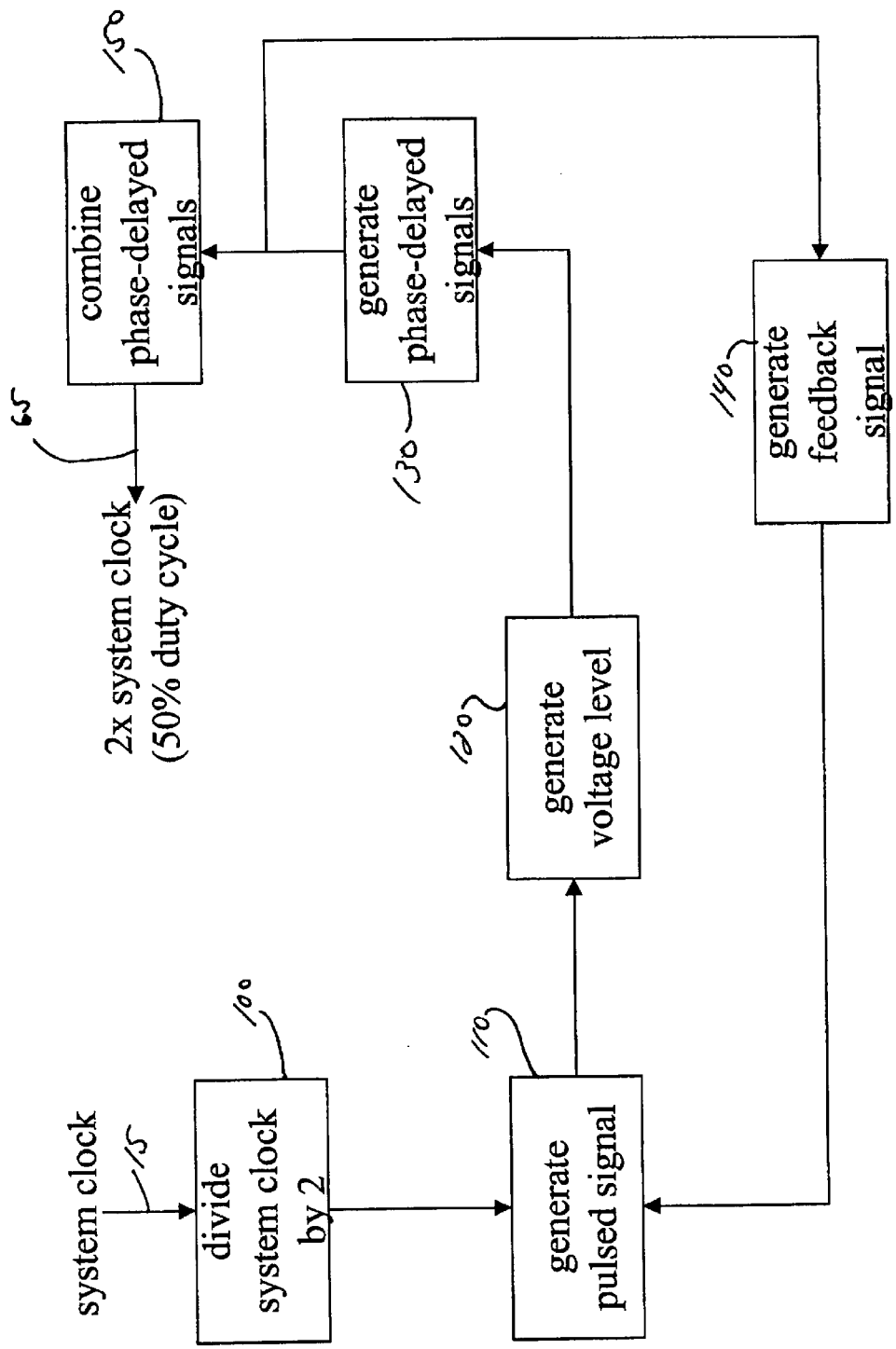
FIG. 5 is a flowchart of a method to synthesize a clock signal using the apparatus of FIG. 1 in accordance with an embodiment of the present invention.

FIG. 5 is a flowchart of a method to synthesize a clock signal using the apparatus of FIG. 1 in accordance with an embodiment of the present invention. In the step 100, the frequency of system clock 15 is divided by a factor of two. In an embodiment of the present invention, the divide-by-two circuit 10 comprises a flip-flop that is clocked by the system clock 15. The flip-flop output changes binary output states on the rising or falling edges of the system clock 15, but not both. As a result, the output of the flip-flop is a half-clock signal 11 at half the frequency of the system clock signal 15 and having a duty cycle of 50%. However, the leading edge of the half-clock signal 11 is delayed in time from the leading edge of the system clock 15 by a time delay of $TD_1$.

The half-clock signal 11 is fed into phase detector 20. In the step 110 of FIG. 5, a pulsed waveform is generated by phase detector 20. The half-clock signal 11 is compared, in phase, to a feedback signal 42 that is generated in the step 140. In an embodiment of the present invention, the feedback signal 42 is an output of the loop delay circuit 50 that is delayed by 180 degrees in phase with respect to the half-clock signal and then inverted. The phase inverter 40 comprises a flip-flop. The 180-degree phase-delayed signal 41 is fed into an input of the flip-flop whose output goes low when the input goes high and vice-versa.

Figure 3:
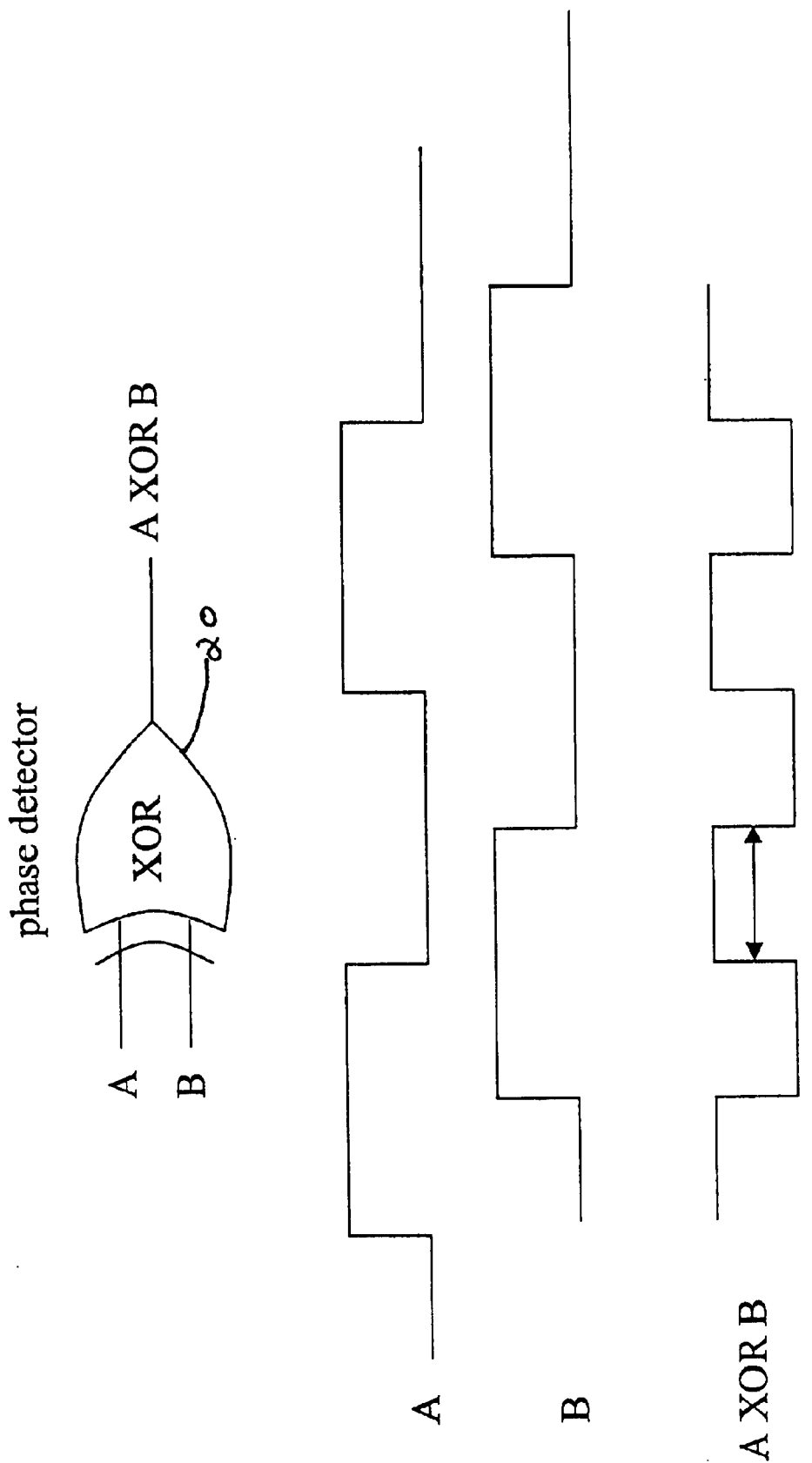
FIG. 3 is a schematic block diagram and associated timing diagram of a phase detector circuit of the apparatus of FIG. 1 in accordance with an embodiment of the present invention.

The pulsewidth of the pulsed waveform is proportional to any phase difference, delta-phase, between the half-clock signal 11 and the feedback signal 42. In an embodiment of the present invention, the phase detector 20 comprises an exclusive OR (XOR) gate as shown in FIG. 3. If signals A and B are inputs to the XOR gate, then the output is A XOR B as shown in FIG. 3. It may be seen that if signals A and B are exactly in phase with each other, the output of the phase detector 20 comprises a constant DC level of, for example, zero volts, indicating a phase-locked state.

The pulsed waveform is fed to the input of charge pump 30 where a voltage level is generated in the step 120. The voltage level is proportional to the pulsewidth of the pulsed waveform and, therefore, to the phase difference, delta-phase.

Figure 2:
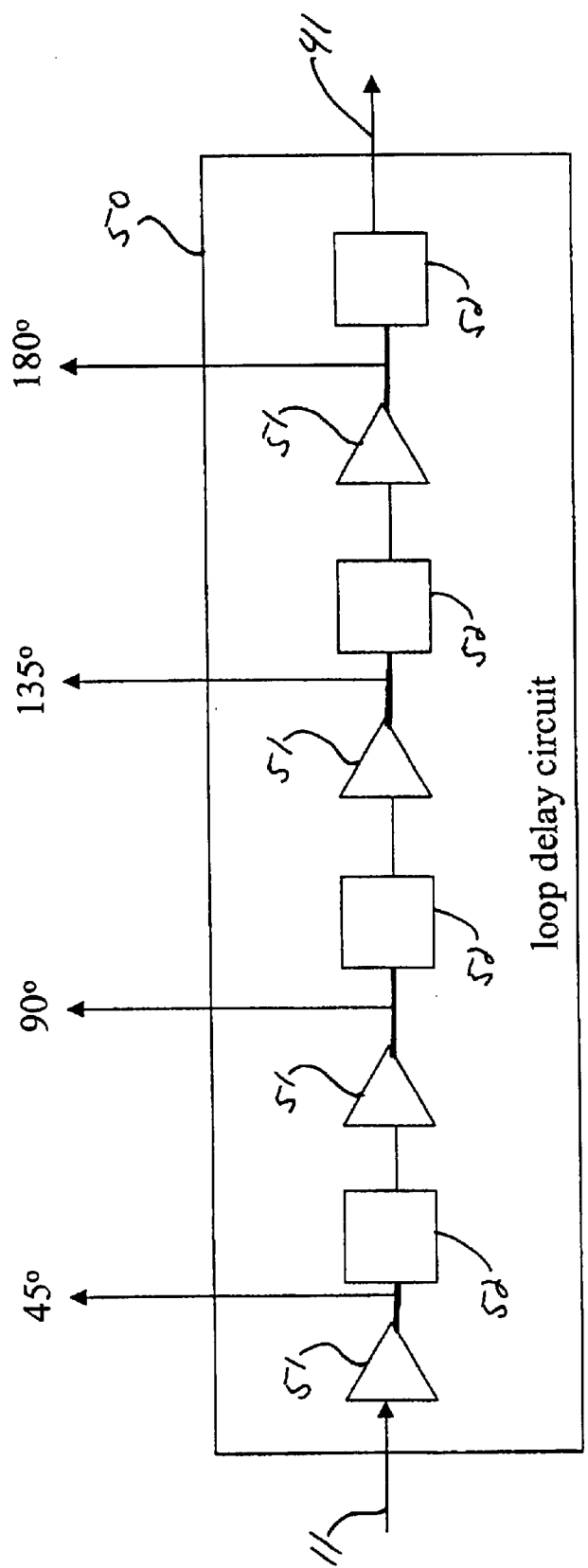
FIG. 2 is a schematic block diagram of an analog loop delay circuit of the apparatus of FIG. 1 in accordance with an embodiment of the present invention.

The voltage level is fed to the loop delay circuit 50 and adjusts the phase delays of the phase-delayed signals that are generated in the step 130. The loop delay circuit 50 comprises a set of analog delay elements 51 and a set of delay cancellers 52 as shown in FIG. 2. In step 130, a set of four phase-delayed signals are generated by loop delay circuit 50. The set of four phase-delayed signals are simply the half clock signal delayed in phase by approximately 45, 90, 135, and 180 degrees, respectively. The delays are kept locked at approximately 45, 90, 135, and 180 degrees by the feedback loop comprising phase detector 20, charge pump 30, loop delay circuit 50, and phase inverter 40. The set of delay cancellers 52 compensate for time delays and duty cycle distortion caused by the divide-by-two circuit 10 and the phase combiner 60. Each delay canceller 52 adds a delay of $(TD_1+TD_2)$ where $TD_1$ is the time delay introduced by the divide-by-two circuit 10 and $TD_2$ is the time delay introduced by the phase combiner 60. As a result, the leading edge of the 2x system clock 65 stays lined up with the leading edge of the system clock 15 and the duty cycle of the 2x system clock 65 remains at 50%.

The set of phase-delayed signals are fed into phase combiner 60 where they are combined in the step 150 to generate a doubled clock signal 65 at twice the frequency of system clock signal 15 and having a duty cycle of 50%.

Figure 4:
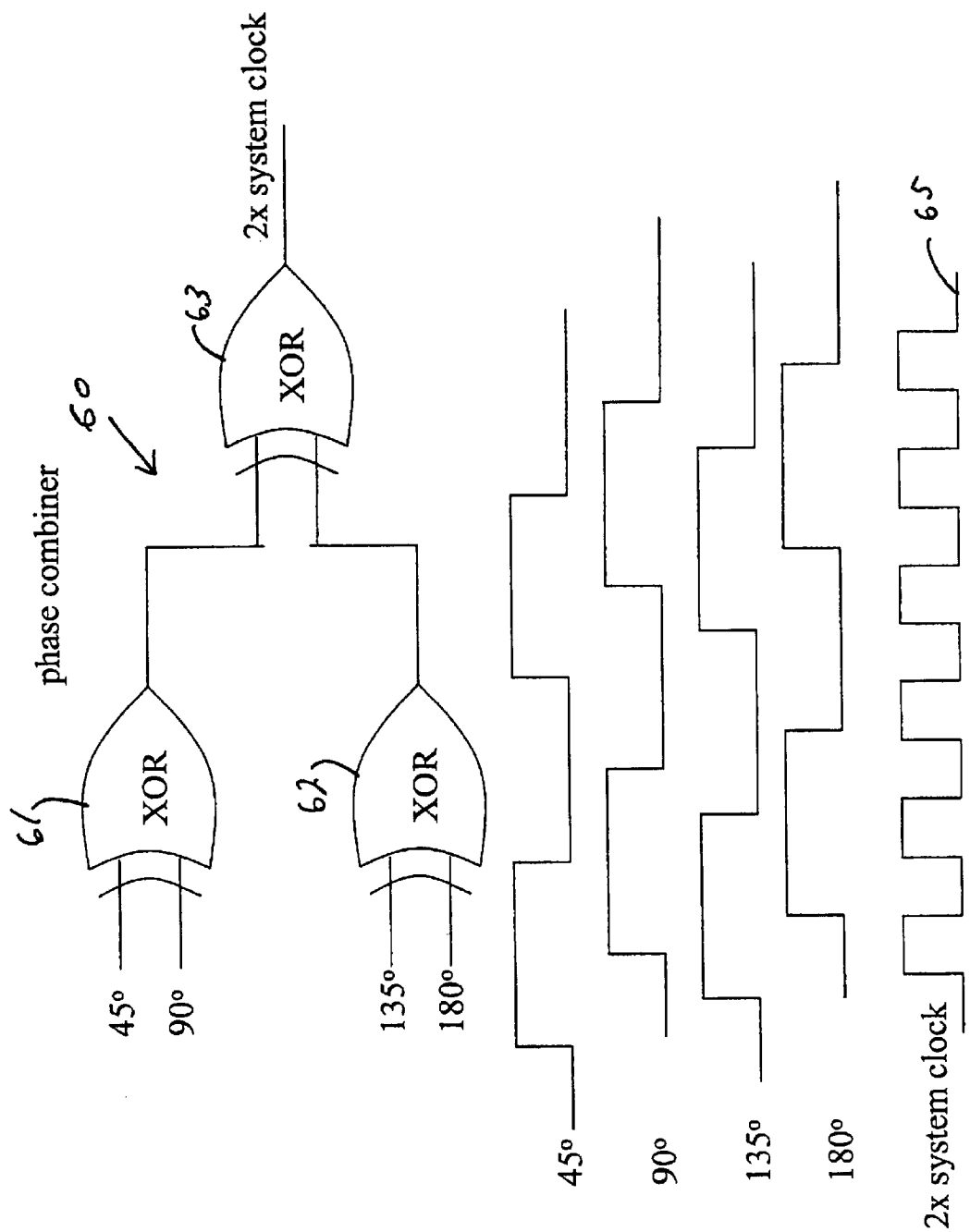
FIG. 4 is a schematic block diagram and associated timing diagram of a phase combiner circuit of the apparatus of FIG. 1 in accordance with an embodiment of the present invention.

In an embodiment of the present invention, the phase combiner is a combination of XOR circuits as shown in FIG. 4 the phase-delayed signals of approximately 45 degrees and 90 degrees are fed into XOR gate 61 and the phase-delayed signals of approximately 135 degrees and 180 degrees are fed into XOR gate 62. The outputs of XOR gates 61 and 62 are fed into the inputs of XOR gate 63. The output of XOR gate 63 is the doubled clock signal 65 as shown in FIG. 4. The doubled clock signal 65 may be used, for example, to double-clock an embedded memory on an ASIC chip. The doubled clock signal 65 may be applied to other applications as well.

As one possible alternative, the phase-delayed signals may be tapped off of the loop delay circuit 50 and used in other applications on the chip. Also, the outputs of XOR gate 61 and/or XOR gate 62 may be tapped off of the phase combiner 60 and used in other applications on the chip.

As a further alternative, the clock synthesizer 5 may be implemented as a circuit of discrete components on, for example, a circuit board, instead of as embedded components on a chip, for applications in any of a plurality of possible discrete circuit layouts.

The various elements of the clock synthesizer 5 may be combined or separated according to various embodiments of the present invention. For example, the phase detector 20 and charge pump 30 may be implemented as a single element instead of as two discrete elements connected in series.

In an embodiment of the present invention, the design consumes a small area and 60% less power by using only ½ of the number of embedded delay elements on-chip (maximum phase delay of 180 degrees) as are needed in a classical full delay locked loop (DLL) design (maximum phase delay of 360 degrees). Furthermore, half clock signal locking error detection is much simpler than full clock locking. Another advantage of a present embodiment is the duty cycle rejection property. Full loop designs (360 degrees) have very limited tolerance to duty cycle variations in the incoming system clock 15. An embodiment of the present invention may easily tolerate input system clock duty cycles of 5% to 95%.

In summary, certain embodiments of the present invention afford an approach to achieve an efficient, low power, low chip area, embedded clock synthesis circuit. The circuit relies on dividing the frequency of a system clock by 2 and phase delaying the resultant half clock signal by a maximum of 180 degrees in a delay-locked loop design to generate a clock signal at twice the frequency of the system clock and having a 50% duty cycle.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. Apparatus for doubling a first frequency of a first clock signal, said apparatus comprising:
    a divide-by-two circuit for receiving said first clock signal and generating a second clock signal at a second frequency that is half of said first frequency, said second clock signal having a duty cycle of 50%;
    a delay locked loop (DLL) circuit responsive to said second clock signal to generate a set of phase-delayed clock signals that are delayed in phase with respect to said second clock signal; and
    a phase combiner circuit responsive to said set of phase-delayed clock signals to generate a third clock signal at a third frequency that is double said first frequency, said third clock signal having a duty cycle of 50%.

2. The apparatus of claim 1 further comprising a phase inverter circuit that generates a feedback clock signal that is an inverted version of one of said phase-delayed clock signals.

3. The apparatus of claim 1 wherein said divide-by-two circuit comprises a flip-flop circuit that changes binary output states on rising edges or falling edges of said first clock signal.

4. The apparatus of claim 1 wherein said set of phase-delayed clock signals comprise:
said second clock signal delayed in phase by 45 degrees;
said second clock signal delayed in phase by 90 degrees;
said second clock signal delayed in phase by 135 degrees; and
said second clock signal delayed in phase by 180 degrees.

5. The apparatus of claim 1 wherein said DLL circuit comprises:
a phase detector circuit responsive to said second clock signal and a feedback clock signal to generate a pulsed waveform;
a charge pump circuit responsive to said pulsed waveform to generate a voltage level; and
a loop delay circuit responsive to said voltage level and said second clock signal to generate said set of phase-delayed clock signals.

6. The apparatus of claim 1 wherein said phase combiner circuit comprises a combination of exclusive OR circuits.

7. The apparatus of claim 1 wherein a duty cycle of said first clock signal comprises a duty cycle of between 5% and 95%.

8. The apparatus of claim 1 wherein said apparatus is implemented on an ASIC chip.

9. The apparatus of claim 5 wherein a pulse width of said pulsed waveform is proportional to a phase difference between said second clock signal and said feedback clock signal.

10. The apparatus of claim 5 wherein said voltage level is proportional to a phase difference between said second clock signal and said feedback clock signal.

11. The apparatus of claim 5 wherein said feedback clock signal comprises an inverted version of one of said set of phase-delayed clock signals.

12. The apparatus of claim 5 wherein said phase detector circuit comprises an exclusive OR circuit.

13. The apparatus of claim 5 wherein said loop delay circuit comprises:
a set of analog delay elements that phase delay said second clock signal; and
a set of delay cancellers that compensate for signal delay and duty cycle distortion of said third clock signal caused by said divide-by-two circuit and said phase combiner circuit.

14. A method for doubling a first frequency of a first clock signal, said method comprising:
generating a second clock signal having a duty cycle of 50% at a second frequency that is half of said first frequency;
generating a set of phase-delayed clock signals using said second clock signal such that said set of phase-delayed clock signals are delayed in phase with respect to said second clock signal; and
generating a third clock signal, using said set of phase-delayed clock signals, at a third frequency that is double said first frequency, said third clock signal having a duty cycle of 50%.

15. The method of claim 14 further comprising phase inverting one of said phase-delayed clock signals to generate a feedback clock signal.

16. The method of claim 14 wherein generating said second clock signal comprises changing a binary state of said second clock signal on rising edges or falling edges of said first clock signal.

17. The method of claim 14 wherein said set of phase-delayed clock signals comprise:
said second clock signal delayed in phase by 45 degrees;
said second clock signal delayed in phase by 90 degrees;
said second clock signal delayed in phase by 135 degrees; and
said second clock signal delayed in phase by 180 degrees.

18. The method of claim 14 wherein generating a set of phase-delayed clock signals comprises:
generating a pulsed waveform by detecting a phase difference between said second clock signal and a feedback clock signal;
generating a voltage level in response to said pulsed waveform; and
phase delaying said second clock signal by a plurality of phase delays using said voltage level.

19. The method of claim 14 wherein generating said set of phase-delayed clock signals comprises exclusive OR-ing said set of phase-delayed clock signals.

20. The method of claim 14 wherein a duty cycle of said first clock signal comprises a duty cycle of between 5% and 95%.

21. The method of claim 14 wherein said method is implemented on an ASIC chip.

22. The method of claim 18 wherein a pulse width of said pulsed waveform is proportional to a phase difference between said second clock signal and said feedback clock signal.

23. The method of claim 18 wherein said voltage level is proportional to a phase difference between said second clock signal and said feedback clock signal.

24. The method of claim 18 wherein said feedback clock signal comprises an inverted version of one of said set of phase-delayed clock signals.

25. The method of claim 18 wherein said detecting a phase difference is performed by exclusive OR-ing said second clock signal and said feedback clock signal.

26. The method of claim 18 wherein said phase delaying said set of phase-delayed clock signals further comprises compensating for signal delay and duty cycle distortion of said third clock signal caused by said generating said second clock signal and by said generating said third clock signal.

27. Apparatus for doubling a first frequency of a first clock signal, said apparatus comprising:
a divide-by-two circuit for receiving said first clock signal and generating a second clock signal at a second frequency that is half of said first frequency, said second clock signal having a duty cycle of 50%;
a phase detector circuit responsive to said second clock signal and a feedback clock signal to generate a pulsed waveform;
a charge pump circuit responsive to said pulsed waveform to generate a voltage level;
a loop delay circuit responsive to said voltage level and said second clock signal to generate a set of phase-delayed clock signals, and wherein said loop delay circuit comprises a set of analog delay elements and a set of delay cancellers; and a phase combiner circuit responsive to said set of phase-delayed clock signals to generate a third clock signal at a third frequency that is double said first frequency, said third clock signal having a duty cycle of 50%, and wherein said set of delay cancellers compensate for signal delay and duty cycle distortion of said third clock signal caused by said divide-by-two circuit and said phase combiner circuit.

28. The apparatus of claim 27 further comprising a phase inverter circuit that generates said feedback clock signal, and wherein said feedback clock signal is an inverted version of one of said phase-delayed clock signals.

29. The apparatus of claim 27 wherein said divide-by-two circuit comprises a flip-flop circuit, and wherein said flip-flop circuit changes binary states on rising edges or falling edges of said first clock signal.

30. The apparatus of claim 27 wherein said set of phase-delayed clock signals comprise:

said second clock signal delayed in phase by 45 degrees;

said second clock signal delayed in phase by 90 degrees;

said second clock signal delayed in phase by 135 degrees; and said second clock signal delayed in phase by 180 degrees.

31. The apparatus of claim 27 wherein said phase combiner circuit comprises a combination of exclusive OR circuits.

32. The apparatus of claim 27 wherein a duty cycle of said first clock signal is in a range of 5% to 95%.

33. The apparatus of claim 27 wherein said apparatus is implemented on an ASIC (application specific integrated circuit) chip.

34. The apparatus of claim 27 wherein a pulse width of said pulsed waveform is proportional to a phase difference between said second clock signal and said feedback clock signal.

35. The apparatus of claim 27 wherein said voltage level is proportional to a phase difference between said second clock signal and said feedback clock signal.

36. The apparatus of claim 27 wherein said phase detector circuit comprises an exclusive OR circuit.

37. A method for doubling a first frequency of a first clock signal, said method comprising:

generating a second clock signal having a duty cycle of 50% at a second frequency that is half of said first frequency;

generating a pulsed waveform by detecting a phase difference between said second clock signal and a feedback clock signal;

generating a voltage level in response to said pulsed waveform;

phase delaying said second clock signal by a plurality of phase delays, in response to said voltage level, to generate a set of phase-delayed clock signals;

generating a third clock signal, in response to said set of phase-delayed clock signals, at a third frequency being double said first frequency, and wherein said third clock signal has a duty cycle of 50%; and compensating for signal delay and duty cycle distortion of said third clock signal caused by said generating said second clock signal and by said generating said third clock signal.

38. The method of claim 37 further comprising phase inverting one of said phase-delayed clock signals to generate said feedback clock signal.

39. The method of claim 37 wherein generating said second clock signal comprises changing a binary state of said second clock signal on rising edges or falling edges of said first clock signal.

40. The method of claim 37 wherein said set of phase-delayed clock signals comprise:

said second clock signal delayed in phase by 45 degrees;

said second clock signal delayed in phase by 90 degrees;

said second clock signal delayed in phase by 135 degrees, and;

said second clock signal delayed in phase by 180 degrees.

41. The method of claim 37 wherein generating said set of phase-delayed clock signals comprises exclusive OR-ing said set of phase-delayed clock signals.

42. The method of claim 37 wherein a duty cycle of said first clock signal is in the range of 5% to 95%.

43. The method of claim 37 wherein said method is implemented on an ASIC (application specific integrated circuit) chip.

44. The method of claim 37 wherein a pulse width of said pulsed waveform is proportional to a phase difference between said second clock signal and said feedback clock signal.

45. The method of claim 37 wherein said voltage level is proportional to a phase difference between said second clock signal and said feedback clock signal.

46. The method of claim 37 wherein said detecting a phase difference is performed by exclusive OR-ing said second clock signal and said feedback clock signal.

* * * * *